(12) United States Patent
Yamamoto

(10) Patent No.: US 12,388,399 B2
(45) Date of Patent: Aug. 12, 2025

(54) CIRCUIT DEVICE, OSCILLATOR, AND METHOD FOR MANUFACTURING OSCILLATOR

(71) Applicant: SEIKO EPSON CORPORATION, Tokyo (JP)

(72) Inventor: Takehiro Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 17 days.

(21) Appl. No.: 18/587,089

(22) Filed: Feb. 26, 2024

(65) Prior Publication Data

US 2024/0291430 A1    Aug. 29, 2024

(30) Foreign Application Priority Data

Feb. 27, 2023    (JP) ................... 2023-027991

(51) Int. Cl.
    *H03B 5/04*    (2006.01)
    *H03B 5/24*    (2006.01)
(52) U.S. Cl.
    CPC ............... *H03B 5/04* (2013.01); *H03B 5/24* (2013.01)
(58) Field of Classification Search
    CPC .............................................. H03B 5/04
    USPC .................................................. 331/65
    See application file for complete search history.

(56) References Cited

U.S. PATENT DOCUMENTS

| 2012/0307581 A1* | 12/2012 | Kodama | ................ G11C 7/10 |
| | | | 365/189.011 |
| 2022/0209716 A1 | 6/2022 | Yamamoto | |
| 2022/0352850 A1* | 11/2022 | Beppu | .................... H03B 5/364 |

FOREIGN PATENT DOCUMENTS

| JP | H05-252007 A | 9/1993 |
| JP | 2022-103739 A | 7/2022 |
| JP | 2022-170966 A | 11/2022 |

* cited by examiner

*Primary Examiner* — Joseph Chang
(74) *Attorney, Agent, or Firm* — Harness, Dickey & Pierce, P.L.C.

(57) ABSTRACT

A circuit device includes a clock signal generation circuit that generates a clock signal, an output circuit that outputs an output clock signal based on the clock signal, and a clock terminal that outputs the output clock signal. The circuit device further includes a test terminal, a storage circuit that stores a duty adjustment value, and a duty adjustment circuit that adjusts a duty of the clock signal based on the duty adjustment value. The output circuit outputs a first DC voltage based on a normal rotation signal of the clock signal to the test terminal in a first state. The output circuit outputs a second DC voltage based on a reverse rotation signal of the clock signal to the test terminal in a second state.

10 Claims, 15 Drawing Sheets

FIG. 10

| | | CTL | XCTL | TGA | CKINA | CKQ | SWT | VTEST |
|---|---|---|---|---|---|---|---|---|
| TEST | FIRST STATE | 0 | 1 | ON | OFF | CK NORMAL ROTATION | ON | VDC1 |
| | SECOND STATE | 1 | 0 | OFF | ON | CK REVERSE ROTATION | ON | VDC2 |
| CLOCK OUTPUT | | 0 | 1 | ON | OFF | CK NORMAL ROTATION | OFF | – |

FIG. 12

|  |  | CTL | ENCT | INV | XINV | NAB OUTPUT | CKINB1 | CKINB2 | CKQ | SWT | VTEST |
|---|---|---|---|---|---|---|---|---|---|---|---|
| TEST | FIRST STATE | 0 | 1 | 0 | 1 | CK REVERSE ROTATION | ON | OFF | CK NORMAL ROTATION | ON | VDC1 |
|  | SECOND STATE | 1 | 0 | 1 | 0 | H | OFF | ON | CK REVERSE ROTATION | ON | VDC2 |
| CLOCK OUTPUT |  | 0 | 1 | 0 | 1 | CK REVERSE ROTATION | ON | OFF | CK NORMAL ROTATION | OFF | — |

FIG. 14

| | | CTL | EN | INV | XINV | XEN | CKQ | OP1,OP2 | VP | VIN | SWC1 | SWC2 | VTEST |
|---|---|---|---|---|---|---|---|---|---|---|---|---|---|
| TEST | FIRST STATE | 0 | 0 | 0 | 1 | 1 | L | ON | CK NORMAL ROTATION | CK REVERSE ROTATION | ON | OFF | VDC1 |
| TEST | SECOND STATE | 1 | 0 | 1 | 0 | 1 | L | ON | CK REVERSE ROTATION | CK NORMAL ROTATION | OFF | ON | VDC2 |
| CLOCK OUTPUT | | - | 1 | 0 | 1 | 0 | CK NORMAL ROTATION | OFF | - | - | - | - | - |

CIRCUIT DEVICE, OSCILLATOR, AND METHOD FOR MANUFACTURING OSCILLATOR

The present application is based on, and claims priority from JP Application Serial Number 2023-027991, filed Feb. 27, 2023, the disclosure of which is hereby incorporated by reference herein in its entirety.

BACKGROUND

1. Technical Field

The present disclosure relates to a circuit device, an oscillator, and a method for manufacturing an oscillator.

2. Related Art

JP-A-05-252007 discloses a clock duty compensation circuit including a low-pass filter, a first inverter, a second inverter, a first resistor, a second resistor, a capacitor, an operational amplifier, and a third resistor. The low-pass filter smooths an input clock signal, the first inverter reverses the signal, the first resistor and the capacitor integrate the signal, and a first DC level thereof is supplied to a non-reverse rotation input of the operational amplifier. The second inverter reverses an output signal of the first inverter, the second resistor and the capacitor integrate the signal, and a second DC level thereof is supplied to a reverse rotation input of the operational amplifier. The operational amplifier corrects a bias by adding a difference value between the first DC level and the second DC level to an output signal of the low-pass filter via the third resistor. The output signal of the low-pass filter subjected to the bias correction is supplied to the first inverter. By performing the bias correction such that the difference value becomes zero, a clock duty is compensated.

JP-A-05-252007 is an example of the related art.

SUMMARY

In JP-A-05-252007, the clock duty compensation circuit always operates, and the operational amplifier feeds back to an input node of the first inverter. Therefore, a noise is generated, and noise characteristics of the clock signal deteriorate.

An aspect of the present disclosure relates to a circuit device including: a clock signal generation circuit configured to generate a clock signal; an output circuit configured to output an output clock signal based on the clock signal; a clock terminal configured to output the output clock signal; a test terminal; a storage circuit configured to store a duty adjustment value; and a duty adjustment circuit configured to adjust a duty of the clock signal based on the duty adjustment value, in which the output circuit outputs a first DC voltage based on a normal rotation signal of the clock signal to the test terminal in a first state, and outputs a second DC voltage based on a reverse rotation signal of the clock signal to the test terminal in a second state.

Another aspect of the present disclosure relates to an oscillator including the above-described circuit device and a resonator configured to generate the clock signal.

Still another aspect of the present disclosure relates to a method for manufacturing an oscillator including a circuit device, the circuit device including: a clock signal generation circuit configured to generate a clock signal; an output circuit configured to output an output clock signal based on the clock signal; a clock terminal configured to output the output clock signal; a test terminal; a storage circuit configured to store a duty adjustment value; and a duty adjustment circuit configured to adjust a duty of the clock signal based on the duty adjustment value, the method for manufacturing an oscillator including: setting the circuit device to a first state in which the output circuit outputs a first DC voltage based on a normal rotation signal of the clock signal to the test terminal; measuring the first DC voltage; setting the circuit device to a second state in which the output circuit outputs a second DC voltage based on a reverse rotation signal of the clock signal to the test terminal; measuring the second DC voltage; and setting the duty adjustment value based on a difference value between the first DC voltage and the second DC voltage and writing the set duty adjustment value to the storage circuit.

BRIEF DESCRIPTION OF THE DRAWINGS

FIG. 10 is an operation explanatory diagram of the first detailed configuration example of the output circuit.

FIG. 12 is an operation explanatory diagram of the second detailed configuration example of the output circuit.

FIG. 14 is an operation explanatory diagram of the third detailed configuration example of the output circuit.

DESCRIPTION OF EMBODIMENTS

Hereinafter, a preferred embodiment of the present disclosure will be described in detail. The embodiment to be described below is not intended to limit the contents described in the claims, and all of the components described in the embodiment are not necessarily essential components.

1. Circuit Device

Figure 1:
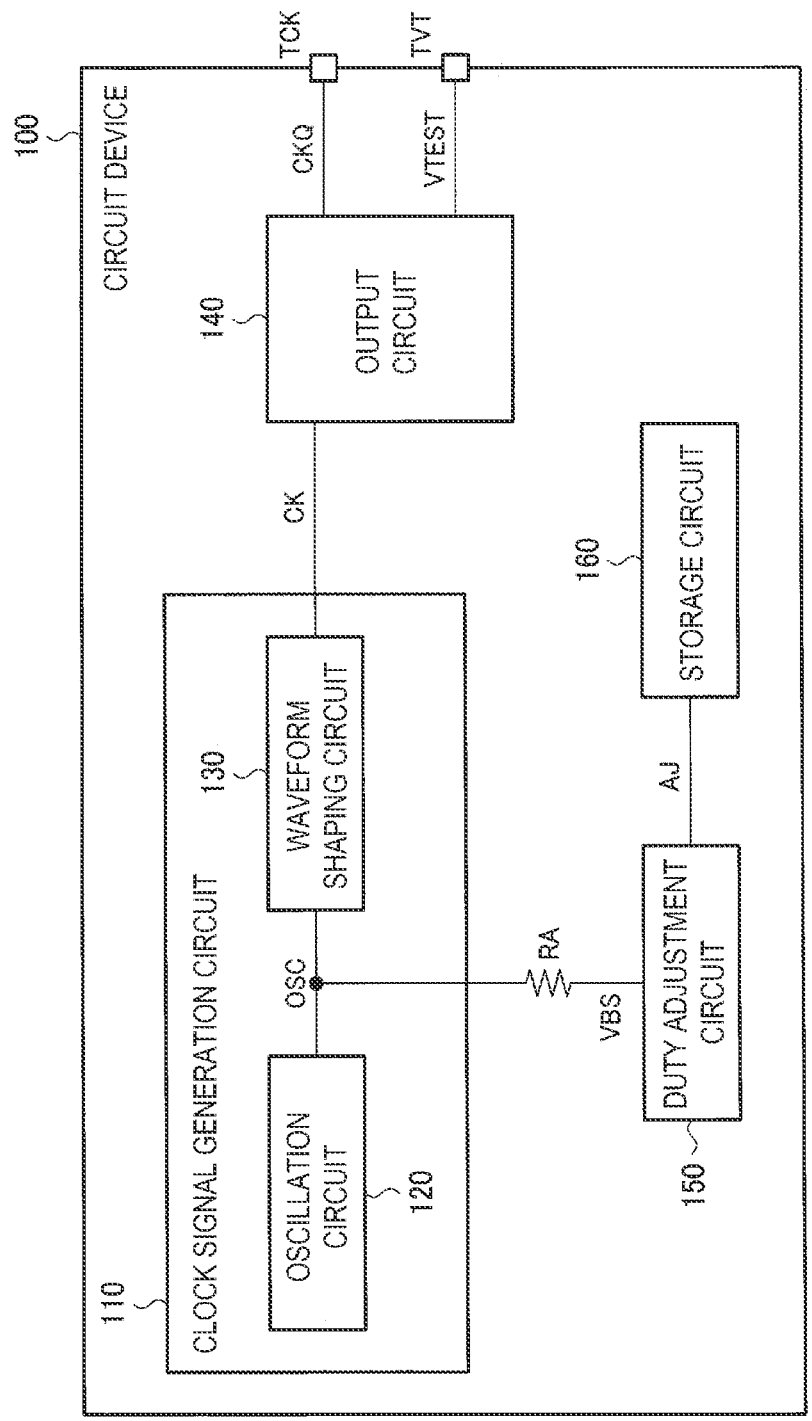
FIG. 1 illustrates a first configuration example of a circuit device.

FIG. 1 illustrates a first configuration example of a circuit device. A circuit device 100 includes a clock signal generation circuit 110, an output circuit 140, a duty adjustment circuit 150, a storage circuit 160, a clock terminal TCK, a test terminal TVT, and a resistor RA. The circuit device 100 is, for example, an integrated circuit device in which a plurality of circuit elements are integrated on a semiconductor substrate.

The clock signal generation circuit 110 generates a clock signal CK that is a periodic rectangular pulse signal. The clock signal generation circuit 110 includes an oscillation circuit 120 and a waveform shaping circuit 130. The clock signal generation circuit 110 may not include the oscillation circuit 120 and receive an oscillation signal OSC from an outside of the circuit device 100.

The oscillation circuit 120 generates the oscillation signal OSC. The oscillation signal OSC is a sine wave signal, is not limited thereto, and may be a signal in which a sine wave is distorted or a signal in which a top and a bottom of a sine wave signal are clipped. Various configurations of the oscillation circuit 120 are assumed. For example, a resonator may be provided outside the circuit device 100, and the oscillation circuit 120 may generate the oscillation signal OSC by driving the resonator. Alternatively, the oscillation circuit 120 may include a resonant circuit that includes an inductor and a capacitor, and a drive circuit that generates the oscillation signal OSC by driving the resonant circuit. At this time, a part or all of the resonant circuit may be provided outside the circuit device 100.

The waveform shaping circuit 130 performs waveform shaping on the oscillation signal OSC to output the clock signal CK. That is, the waveform shaping circuit 130 shapes the oscillation signal OSC which is the sine wave signal into the clock signal CK which is a rectangular pulse signal. The waveform shaping circuit 130 is, for example, one or more stages of inverters coupled in series. In the embodiment, coupling between circuit elements is electrical coupling. The electrical coupling is coupling in which an electrical signal can be transmitted and information can be transmitted by the electrical signal. The electrical coupling may be coupling via a passive element or an active element.

The storage circuit 160 stores a duty adjustment value AJ. The storage circuit 160 is a nonvolatile memory, a volatile memory, a register, or the like. The nonvolatile memory is, for example, an OTP memory or an EEPROM. The volatile memory is, for example, an SRAM or a DRAM.

The duty adjustment circuit 150 adjusts a duty of the clock signal CK based on the duty adjustment value AJ. The duty is a ratio of a high-level period to one cycle of a clock signal. The duty adjustment value AJ is data for controlling a voltage value of a bias voltage VBS. The duty adjustment circuit 150 sets a bias voltage of the oscillation signal OSC by setting the bias voltage VBS to an input node of the waveform shaping circuit 130 via the resistor RA. The oscillation circuit 120 outputs an AC component of an oscillation signal by using AC coupling such as a capacitor. A signal in which the bias voltage VBS is set with respect to the AC component is input to the waveform shaping circuit 130 as the oscillation signal OSC. Since the duty of the clock signal CK changes when the bias voltage VBS changes, the duty of the clock signal CK is set based on the duty adjustment value AJ.

The output circuit 140 buffers the clock signal CK and outputs the buffered signal to the clock terminal TCK as an output clock signal CKQ. Various external circuits using the output clock signal CKQ may be coupled to the clock terminal TCK. The circuit device 100 is set to a test mode in a test such as an inspection process. At this time, the output circuit 140 outputs a DC voltage VTEST based on the clock signal CK to the test terminal TVT. The output circuit 140 has a first state in which a first DC voltage based on a normal rotation signal of the clock signal CK is output as the DC voltage VTEST and a second state in which a second DC voltage based on a reverse rotation signal of the clock signal CK is output as the DC voltage VTEST. The first DC voltage is a signal obtained by smoothing the normal rotation signal of the clock signal CK, and the second DC voltage is a signal obtained by smoothing the reverse rotation signal of the clock signal CK. A smoothing circuit may be provided in the output circuit 140, or a part thereof may be provided outside the circuit device 100.

An external device such as an inspection device determines the duty adjustment value AJ such that a difference value between the first DC voltage and the second DC voltage is minimized, thereby determining the duty adjustment value AJ at which the output clock signal CKQ having a duty of 50% is obtained. The circuit device 100 is set to a normal operation mode at a time of a normal operation such as when being incorporated into a product and used. At this time, the duty adjustment circuit 150 uses the duty adjustment value AJ determined in the test. Accordingly, the output clock signal CKQ having the duty of 50% is output.

Figure 2:
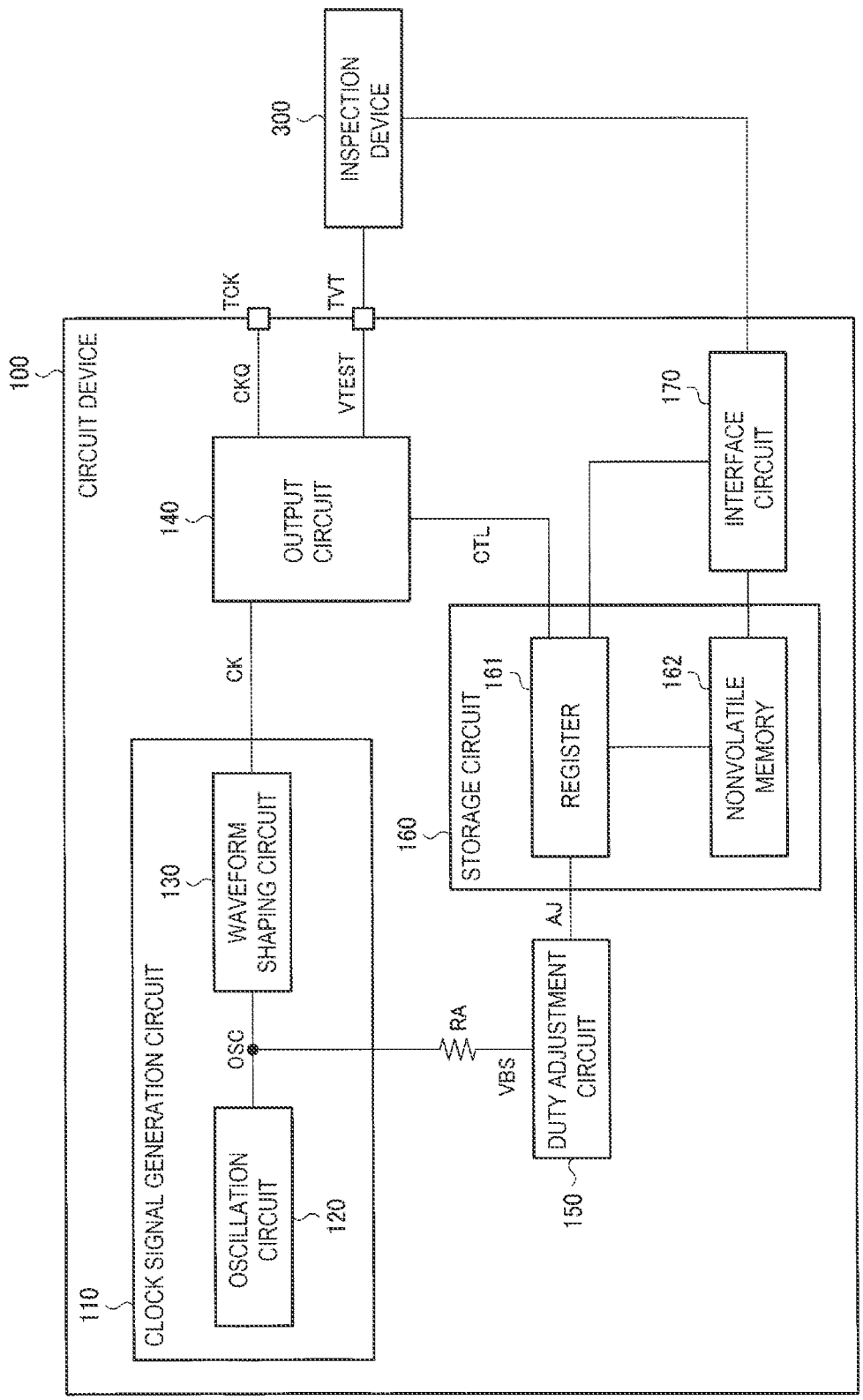
FIG. 2 illustrates a second configuration example of the circuit device and a coupling configuration example during a test.

FIG. 2 illustrates a second configuration example of the circuit device and a coupling configuration example during the test. Hereinafter, the same components as those in FIG. 1 are denoted by the same reference numerals as in FIG. 1, and description of the components is appropriately omitted. The circuit device 100 includes an interface circuit 170. Further, the storage circuit 160 includes a register 161 and a nonvolatile memory 162.

An inspection device 300 is coupled to the test terminal TVT in an inspection process of the circuit device 100 or an oscillator including the circuit device 100. The interface circuit 170 performs communication between the inspection device 300 and the circuit device 100. At a time of duty adjustment, the interface circuit 170 receives a state setting signal CTL for switching between the first state and the second state and the duty adjustment value AJ from the inspection device 300, and writes the state setting signal CTL and the duty adjustment value AJ to the register 161. After the final duty adjustment value AJ is determined, the interface circuit 170 receives the determined duty adjustment value AJ from the inspection device 300 and writes the duty adjustment value AJ to the nonvolatile memory 162. The interface circuit 170 may be various digital communication interface circuits, and is, for example, a serial communication interface circuit such as an SPI method or an I2C method.

The duty adjustment circuit 150 uses the duty adjustment value AJ stored in the register 161. At the time of the duty adjustment, the duty adjustment value AJ written from the inspection device 300 to the register 161 is used. At the time of the normal operation, the duty adjustment value AJ is loaded from the nonvolatile memory 162 into the register 161 at initialization of the circuit device 100 and is used.

Figure 3:
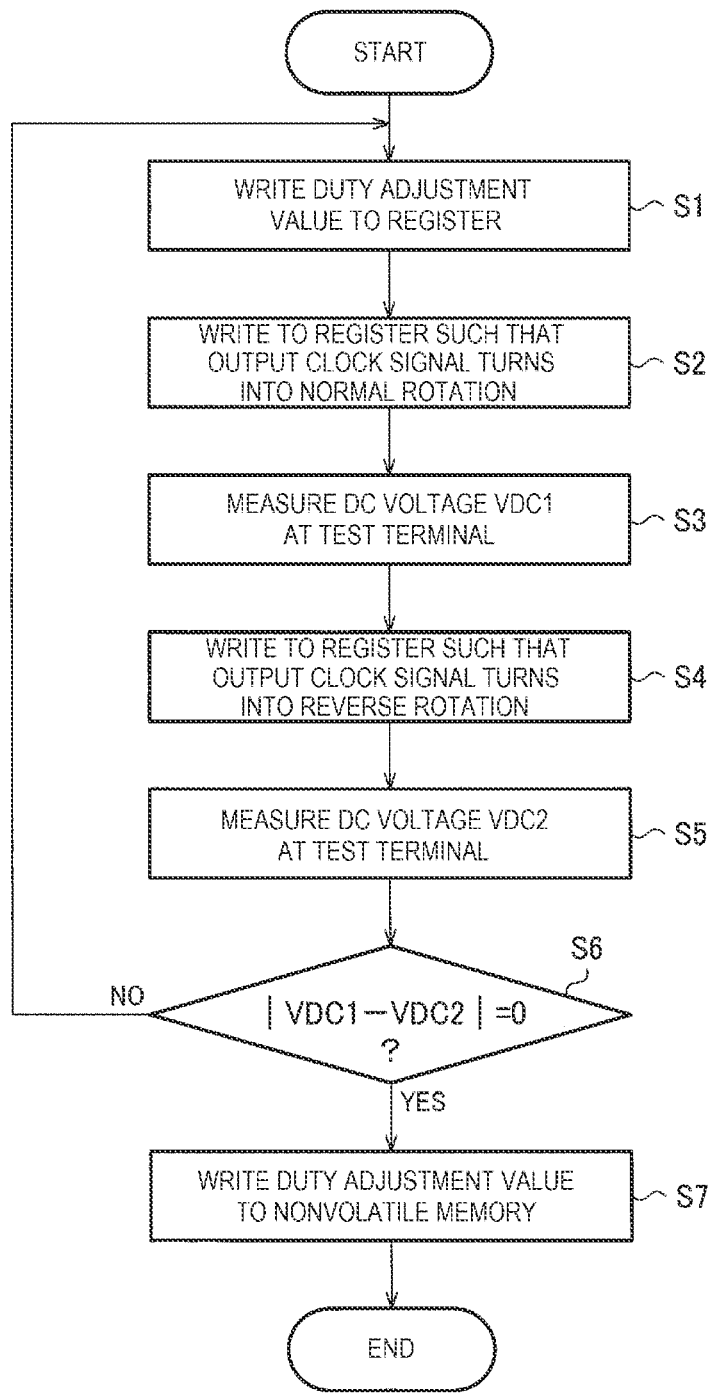
FIG. 3 is an example of a flowchart of duty adjustment.

FIG. 3 is an example of a flowchart of the duty adjustment. In step S1, the inspection device 300 writes the duty adjustment value AJ to the register 161. In step S1 for a first time, an initial value of duty adjustment value AJ is written.

In step S2, the inspection device 300 writes the state setting signal CTL to the register 161 such that the output clock signal CKQ is the normal rotation signal of the clock signal CK. The output circuit 140 is set to the first state, and outputs the first DC voltage based on the normal rotation signal of the clock signal CK to the test terminal TVT. The first DC voltage is represented by VDC1.

In step S3, the inspection device 300 measures a voltage value of the first DC voltage VDC1 output from the test terminal TVT.

In step S4, the inspection device 300 writes the state setting signal CTL to the register 161 such that the output clock signal CKQ is the reverse rotation signal of the clock signal CK. The output circuit 140 is set to the second state, and outputs the second DC voltage based on the reverse rotation signal of the clock signal CK to the test terminal TVT. The second DC voltage is represented by VDC2.

In step S5, the inspection device 300 measures a voltage value of the second DC voltage VDC2 output from the test terminal TVT.

The inspection device 300 determines whether an absolute value of a difference value between the first DC voltage VDC1 and the second DC voltage VDC2 is zero. When the absolute value of the difference value is not zero, the inspection device 300 returns to step S1 and writes a duty adjustment value different from a previous duty adjustment value to the register 161. When the absolute value of the difference value is zero, the inspection device 300 writes the current duty adjustment value to the nonvolatile memory 162 in step S7. Accordingly, a duty adjustment value when the absolute value of the difference value between the first DC voltage VDC1 and the second DC voltage VDC2 is zero is written to the nonvolatile memory 162, and is used in the normal operation of the circuit device 100.

Figure 4:
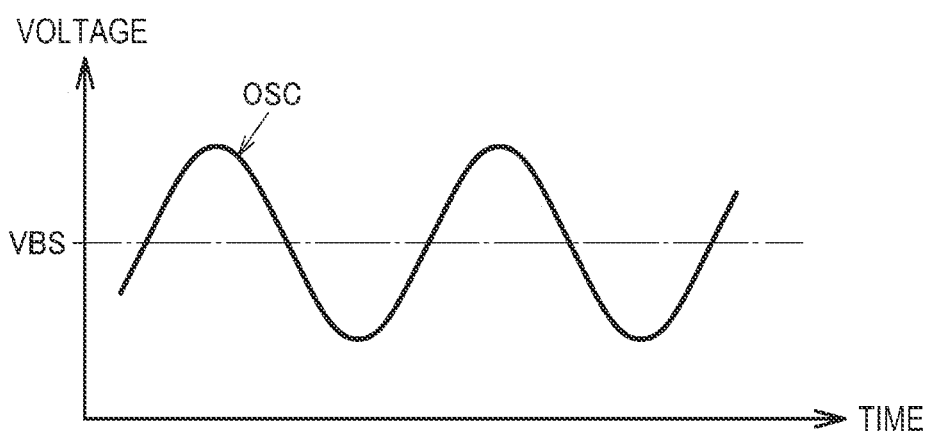
FIG. 4 is a diagram illustrating a duty adjustment method.
Figure 4:
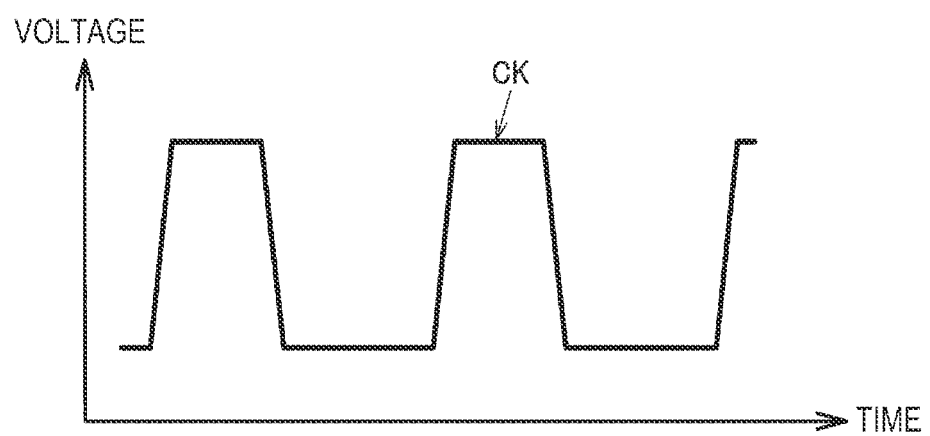
Figure 4:
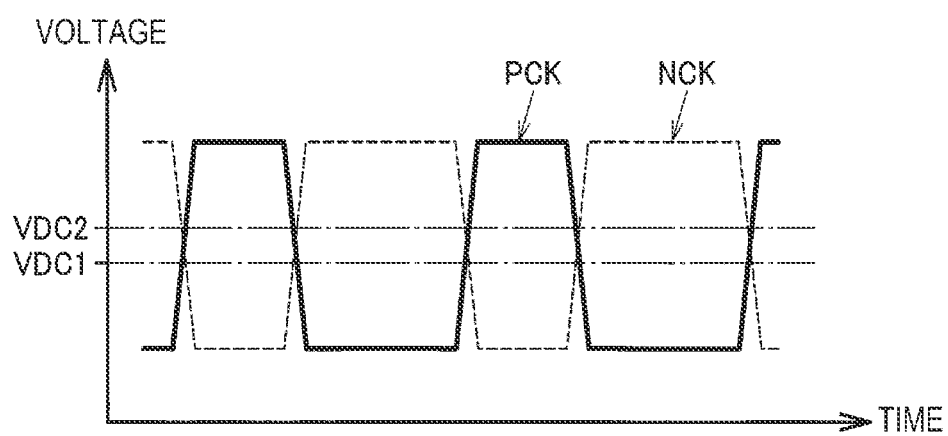

A duty adjustment method will be described with reference to FIGS. 4 and 5. FIG. 4 illustrates a signal waveform example of the circuit device 100.

As illustrated in an upper part and a middle part of FIG. 4, the waveform shaping circuit 130 shapes the oscillation signal OSC that is the sine wave signal into the clock signal CK that is the rectangular wave signal. While the oscillation signal OSC exceeds a predetermined voltage, the clock signal CK is at a high level. Therefore, when the bias voltage VBS of the oscillation signal OSC changes, the duty of the clock signal CK changes.

As illustrated in a lower part of FIG. 4, the output circuit 140 outputs the first DC voltage VDC1 obtained by smoothing a normal rotation signal PCK of the clock signal CK in the first state. For example, the first state is a state in which the output clock signal CKQ of a normal rotation logic with respect to the clock signal CK is output, and the output circuit 140 outputs the first DC voltage VDC1 by using the output clock signal CKQ as the normal rotation signal PCK. A method for generating the first DC voltage is not limited thereto, and the normal rotation signal PCK may be a clock signal of the normal rotation logic with respect to the clock signal CK.

The output circuit 140 outputs the second DC voltage VDC2 obtained by smoothing a reverse rotation signal NCK of the clock signal CK in the second state. For example, the second state is a state in which the output clock signal CKQ of a reverse rotation logic with respect to the clock signal CK is output, and the output circuit 140 outputs the second DC voltage VDC2 by using the output clock signal CKQ as the reverse rotation signal NCK. A method for generating the second DC voltage is not limited thereto, and the reverse rotation signal NCK may be a clock signal of the reverse rotation logic with respect to the clock signal CK.

Figure 5:
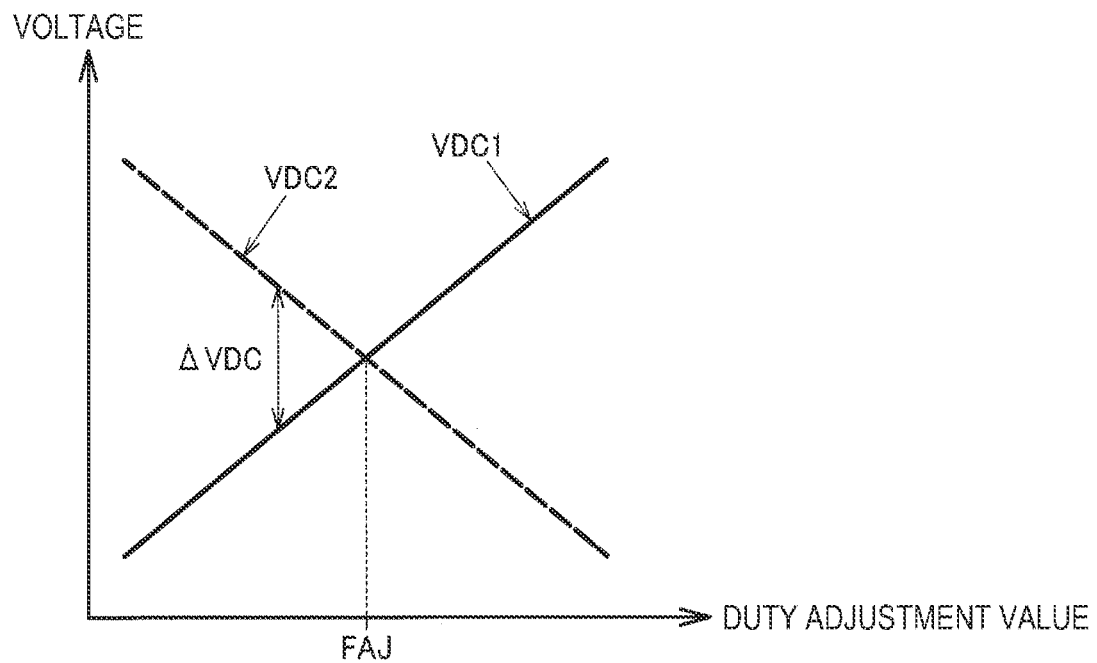
FIG. 5 is a diagram illustrating a duty adjustment method.
Figure 5:
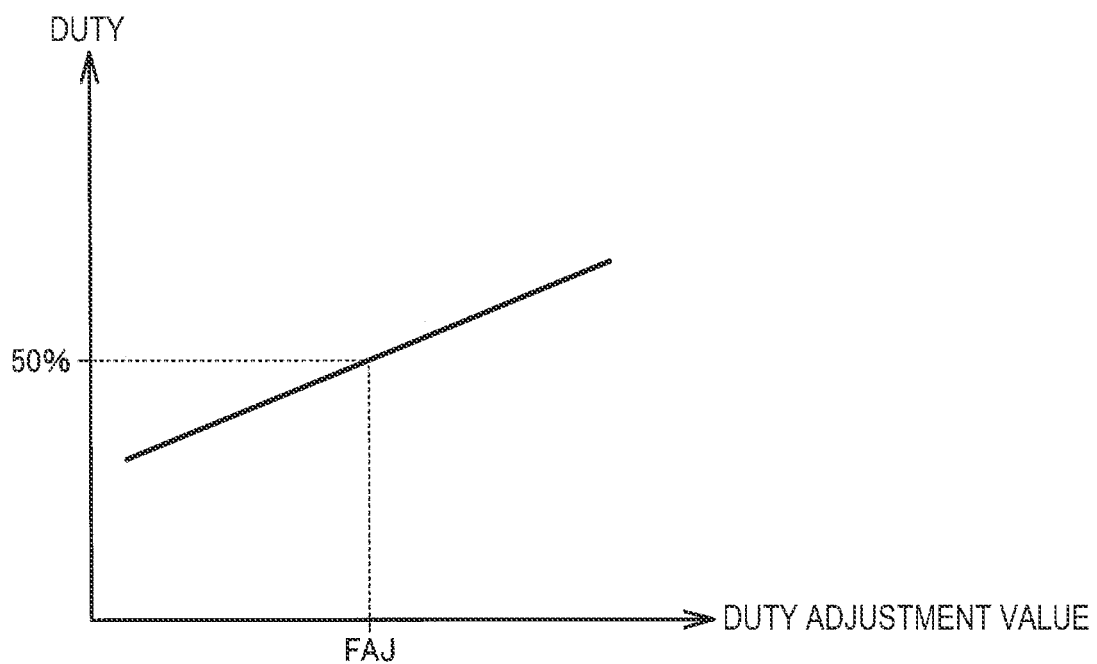

FIG. 5 is a diagram illustrating a correlation between the duty adjustment value and a duty of the output clock signal.

As illustrated in an upper part of FIG. 5, the inspection device 300 determines the duty adjustment value at which $\Delta VDC=|VDC1-VDC2|=0$ as a final duty adjustment value FAJ, and writes the duty adjustment value FAJ to the nonvolatile memory 162 of the circuit device 100.

A lower part of FIG. 5 illustrates a correlation between the duty adjustment value and a duty of the output clock signal CKQ. Since the bias voltage VBS of the oscillation signal OSC changes when the duty adjustment value changes, the duty of the clock signal CK, that is, the duty of the output clock signal CKQ changes. When a duty of the normal rotation signal PCK of the clock signal CK in FIG. 4 is equal to a duty of the reverse rotation signal NCK of the clock signal CK, that is, when both of the duties are 50%, VDC1=VDC2. Accordingly, by determining the duty adjustment value FAJ such that $\Delta VDC=|VDC1-VDC2|=0$, the inspection device 300 can determine the duty adjustment value FAJ at which the duty of the output clock signal CKQ is 50%. As will be described later, a duty can be adjusted with higher accuracy by performing the duty adjustment by using $\Delta VDC$ which is the difference value than when performing the duty adjustment by directly using the DC voltage.

Figure 6:
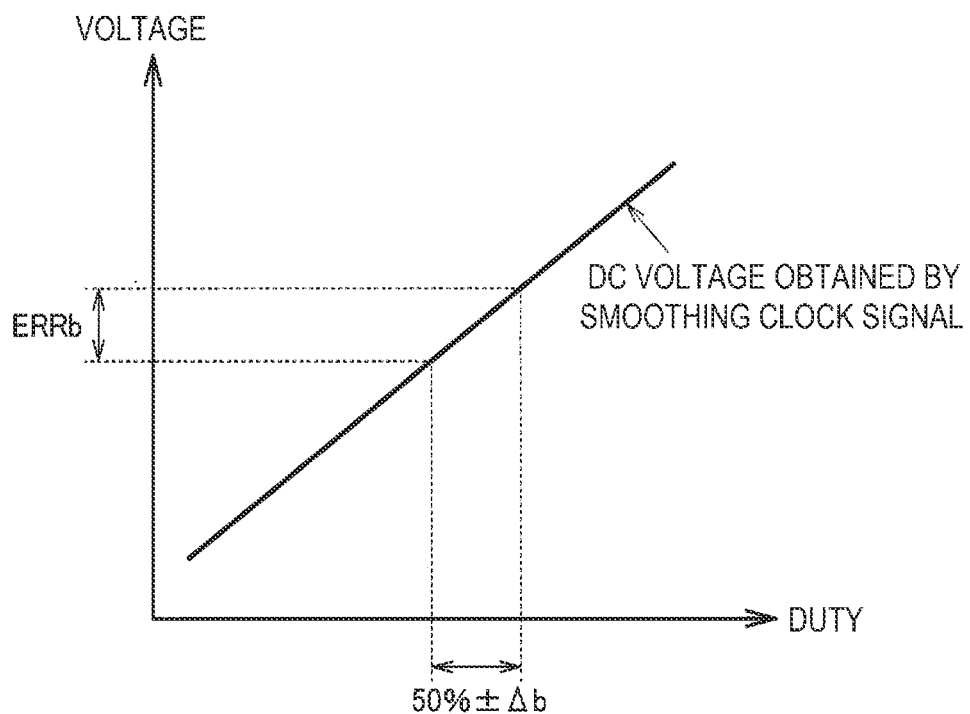
FIG. 6 is a diagram illustrating a duty error when the duty adjustment is performed by using a DC voltage obtained by smoothing a clock signal.

FIG. 6 is a diagram illustrating a duty error when the duty adjustment is performed by directly using the DC voltage obtained by smoothing the clock signal.

The inspection device measures a voltage value of the DC voltage and compares a measurement value with an expected value to determine a duty adjustment value at which a duty is 50%. At this time, since there is a measurement error ERRb of the DC voltage, an error $\Delta b$ occurs with respect to the ideal duty of 50%. For example, when the inspection device performs A/D conversion on the DC voltage and compares A/D output data with expected value data, the error $\Delta b$ of the duty occurs due to an A/D conversion error. The expected value is assumed to be ½ of a clock amplitude. At this time, when the clock amplitude is not ideal due to an error of a power supply voltage or the like, the DC voltage at the duty of 50% does not match the expected value, and accordingly, the error $\Delta b$ of the duty occurs.

Figure 7:
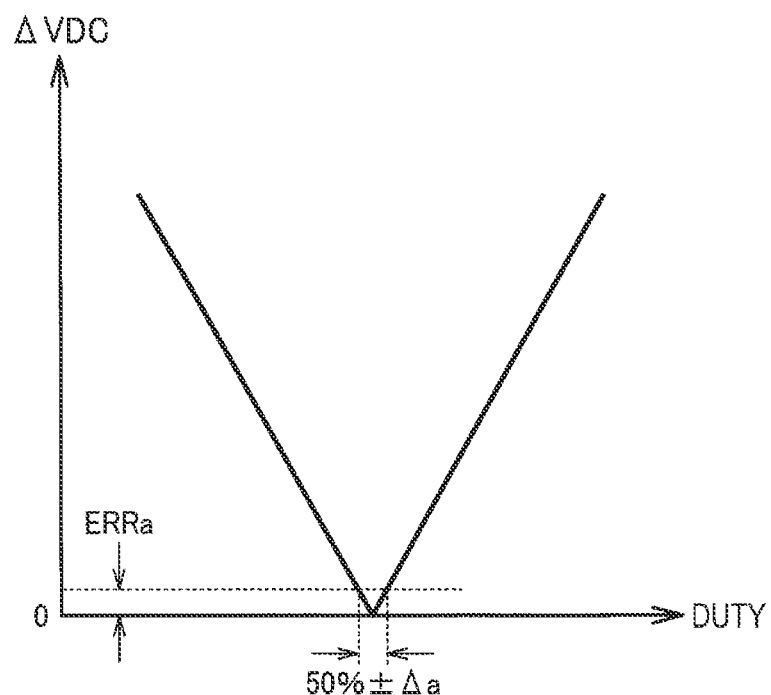
FIG. 7 is a diagram illustrating a duty error in the embodiment.

FIG. 7 is a diagram illustrating a duty error in the embodiment. According to the embodiment, the inspection device determines the duty adjustment value at which the duty is 50% by determining the duty adjustment value at which the difference value between the first DC voltage and the second DC voltage is zero. By using the difference value, a measurement error occurring in each of the first DC voltage and the second DC voltage can be canceled. For example, the A/D conversion error or an expected value error is canceled by a difference. Accordingly, an error $\Delta ERRa$ included in the difference value between the first DC voltage and the second DC voltage is reduced, and an error $\Delta a$ with respect to the ideal duty of 50% can be reduced. The error $\Delta a$ is smaller than the error $\Delta b$ in FIG. 6.

According to the embodiment, the circuit device 100 includes the clock signal generation circuit 110 that generates the clock signal CK, the output circuit 140 that outputs the output clock signal CKQ based on the clock signal CK, and the clock terminal TCK that outputs the output clock signal CKQ. The circuit device 100 further includes the test terminal TVT, the storage circuit 160 that stores the duty adjustment value AJ, and the duty adjustment circuit 150 that adjusts the duty of the clock signal CK based on the duty adjustment value AJ. In the first state, the output circuit 140 outputs the first DC voltage VDC1 based on the normal rotation signal of the clock signal CK to the test terminal TVT. In the second state, the output circuit 140 outputs the second DC voltage VDC2 based on the reverse rotation signal of the clock signal CK to the test terminal TVT.

Accordingly, the circuit device 100 can output the first DC voltage VDC1 based on the normal rotation signal of the clock signal CK and the second DC voltage VDC2 based on the reverse rotation signal of the clock signal CK from the test terminal TVT. Accordingly, the external device such as the inspection device 300 can determine the duty adjustment value AJ at which a duty ratio of the output clock signal CKQ is 50% by using the difference value between the first DC voltage VDC1 and the second DC voltage VDC2 which are output from the test terminal TVT. When the duty increases, the first DC voltage VDC1 increases and the second DC voltage VDC2 decreases. Therefore, the external device can set the duty ratio of the output clock signal CKQ to 50% by determining the duty adjustment value AJ such that the difference value is minimized.

In JP-A-05-252007, since duty adjustment is performed based on feedback, the noise characteristics of the clock signal may deteriorate due to a noise in the feedback. According to the embodiment, since the duty of the output clock signal CKQ is adjusted without using the feedback, noise characteristics can be improved.

Further, the measurement error of each of the first DC voltage VDC1 and the second DC voltage VDC2 can be canceled by using the difference value between the first DC voltage VDC1 and the second DC voltage VDC2. Therefore, when the difference value is used, the measurement error is smaller than when the DC voltage is used directly, and the duty ratio can be set to 50% accurately.

The circuit device 100 of the embodiment includes the register 161 and the interface circuit 170. The register 161 stores the state setting signal CTL for switching between the first state and the second state. The interface circuit 170 receives the state setting signal CTL from an outside and writes the received state setting signal CTL to the register 161.

Accordingly, the state setting signal CTL can be written from the external device such as the inspection device 300 to the register 161 via the interface circuit 170. Accordingly, the external device such as the inspection device 300 can acquire the first DC voltage VDC1 when the output circuit 140 is set to the first state, acquire the second DC voltage VDC2 when the output circuit 140 is set to the second state, and determine the duty adjustment value based on the difference value.

The embodiment may be performed by a method for manufacturing the oscillator including the circuit device 100. The method for manufacturing includes setting the circuit device 100 to the first state in which the output circuit 140 outputs the first DC voltage VDC1 based on the normal rotation signal of the clock signal CK to the test terminal TVT and measuring the first DC voltage VDC1. The method for manufacturing includes setting the circuit device 100 to the second state in which the output circuit 140 outputs the second DC voltage VDC2 based on the reverse rotation signal of the clock signal CK to the test terminal TVT and measuring the second DC voltage VDC2. In the manufacturing method, the duty adjustment value AJ is set based on the difference value between the first DC voltage VDC1 and the second DC voltage VDC2, and the set duty adjustment value AJ is written to the storage circuit 160.

2. Detailed Configuration Example

Figure 8:
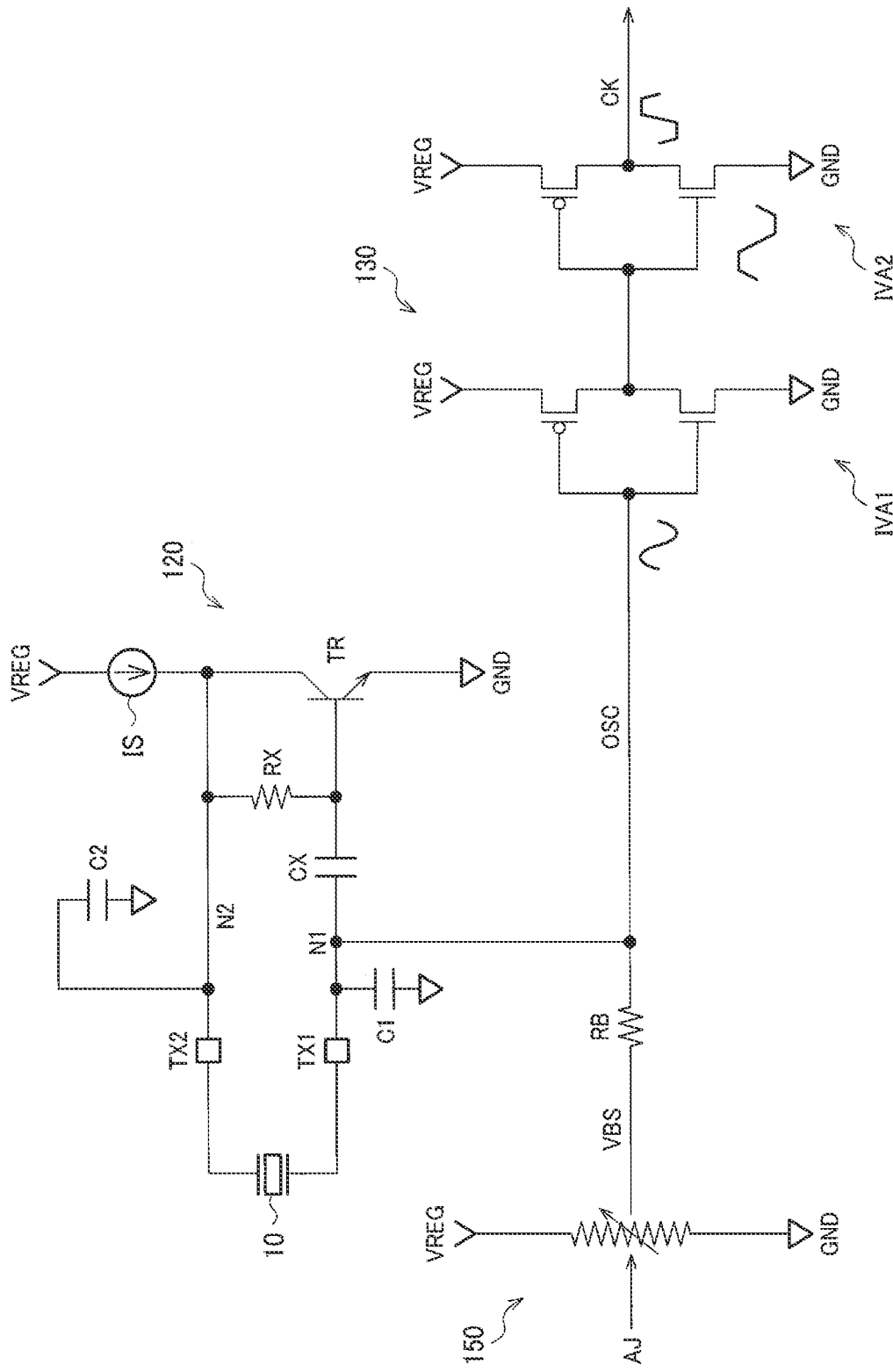
FIG. 8 illustrates a detailed configuration example of an oscillation circuit, a waveform shaping circuit, and a duty adjustment circuit.

FIG. 8 is a detailed configuration example of an oscillation circuit, a waveform shaping circuit, and a duty adjustment circuit. Here, an example in which the oscillation circuit 120 is a pierce type oscillation circuit using a resonator will be described. The oscillation circuit 120 is not limited to the configuration in FIG. 8, and may be, for example, a Colpitts type or Hartley type oscillation circuit.

The oscillation circuit 120 includes a current source circuit IS, a bipolar transistor TR, a resistor RX, and capacitors CX, C1, and C2.

Terminals TX1 and TX2 are terminals of the circuit device 100, and are, for example, pads of the integrated circuit device. One end of a resonator 10 is coupled to the terminal TX1, and the other end is coupled to the terminal TX2. The resonator 10 is an element that generates mechanical resonation by an electric signal. The resonator 10 can be implemented by a resonator element such as a crystal resonator element. For example, the resonator 10 is a crystal resonator element that resonates through thickness shear, with a cut angle such as AT cut or SC cut. Alternatively, the resonator 10 may be a tuning fork type crystal resonator element. Alternatively, the resonator 10 may be various resonator elements such as a resonator element other than the thickness-shear resonator type or the tuning fork type, or a piezoelectric resonator element formed of a material other than quartz crystal. For example, the resonator 10 may be an SAW resonator or an MEMS resonator as a silicon resonator formed by using a silicon substrate. SAW is an abbreviation for surface acoustic wave, and MEMS is an abbreviation for micro electro mechanical systems.

A node coupled to the terminal TX1 is referred to as a first node N1, and a node coupled to the terminal TX2 is referred to as a second node N2. The current source circuit IS is provided between a node of a power supply voltage VREG and the second node N2, and outputs a current for driving the oscillation circuit 120 to the second node N2. A collector of the bipolar transistor TR is coupled to the second node N2, and an emitter thereof is coupled to a node of a ground voltage GND. One end of the resistor RX is coupled to the second node N2, and the other end thereof is coupled to a base of the bipolar transistor TR. One end of the capacitor CX is coupled to the first node N1, and the other end thereof is coupled to the base of the bipolar transistor TR. One end of the capacitor C1 is coupled to the first node N1, and the other end thereof is coupled to the node of the ground voltage GND. One end of the capacitor C2 is coupled to the second node N2, and the other end thereof is coupled to the node of the ground voltage GND.

The duty adjustment circuit 150 generates a plurality of voltages by dividing a voltage between the power supply voltage VREG and the ground voltage GND, and outputs a voltage selected based on the duty adjustment value AJ among the plurality of voltages as the bias voltage VBS. The duty adjustment circuit 150 includes, for example, a ladder resistor circuit and a selector. The ladder resistor circuit generates the plurality of voltages by dividing the voltage between the power supply voltage VREG and the ground voltage GND. The selector selects the voltage indicated by the duty adjustment value AJ among the plurality of voltages from the ladder resistor circuit, and outputs the selected voltage as the bias voltage VBS.

One end of a resistor RB is coupled to an output node of the duty adjustment circuit 150, and the other end thereof is coupled to the first node N1 of the oscillation circuit 120. The first node N1 is a node that is DC-cut by the capacitor CX and the resonator 10 in an oscillation loop of the oscillation circuit 120. The duty adjustment circuit 150 sets the bias voltage VBS at the first node N1 via the resistor RB. In this way, the bias voltage VBS of the oscillation signal OSC is set based on the duty adjustment value AJ.

The waveform shaping circuit 130 includes an inverter IVA1 and an inverter IVA2. Each inverter is implemented by a P-type MOS transistor and an N-type MOS transistor coupled in series between the node of the power supply voltage VREG and the node of the ground voltage GND. The inverter IVA1 receives the oscillation signal OSC, and the inverter IVA2 receives an output signal of the inverter IVA1 and outputs the clock signal CK. The oscillation signal OSC is waveform-shaped into the clock signal CK by gains of the inverter IVA1 and the inverter IVA2. Here, an example in which the waveform shaping circuit 130 is implemented by two stages of inverters is described. The waveform shaping circuit 130 is not limited thereto, and may be implemented by one stage or three or more stages of inverters.

According to the embodiment, the clock signal generation circuit 110 includes the oscillation circuit 120 that generates the oscillation signal OSC and the waveform shaping circuit 130 that waveform-shapes the oscillation signal OSC to output the clock signal CK. The duty adjustment circuit 150 sets, based on the duty adjustment value AJ, the bias voltage VBS of the oscillation signal OSC input to the waveform shaping circuit 130.

Accordingly, the bias voltage VBS of the oscillation signal OSC input to the waveform shaping circuit 130 is set based on the duty adjustment value AJ. The duty of the clock signal CK output from the waveform shaping circuit 130 changes depending on the bias voltage VBS of the oscillation signal OSC, and the clock signal CK is buffered by the output circuit 140 and output as the output clock signal CKQ. In this way, the duty of the output clock signal CKQ can be adjusted based on the duty adjustment value AJ.

Figure 9:
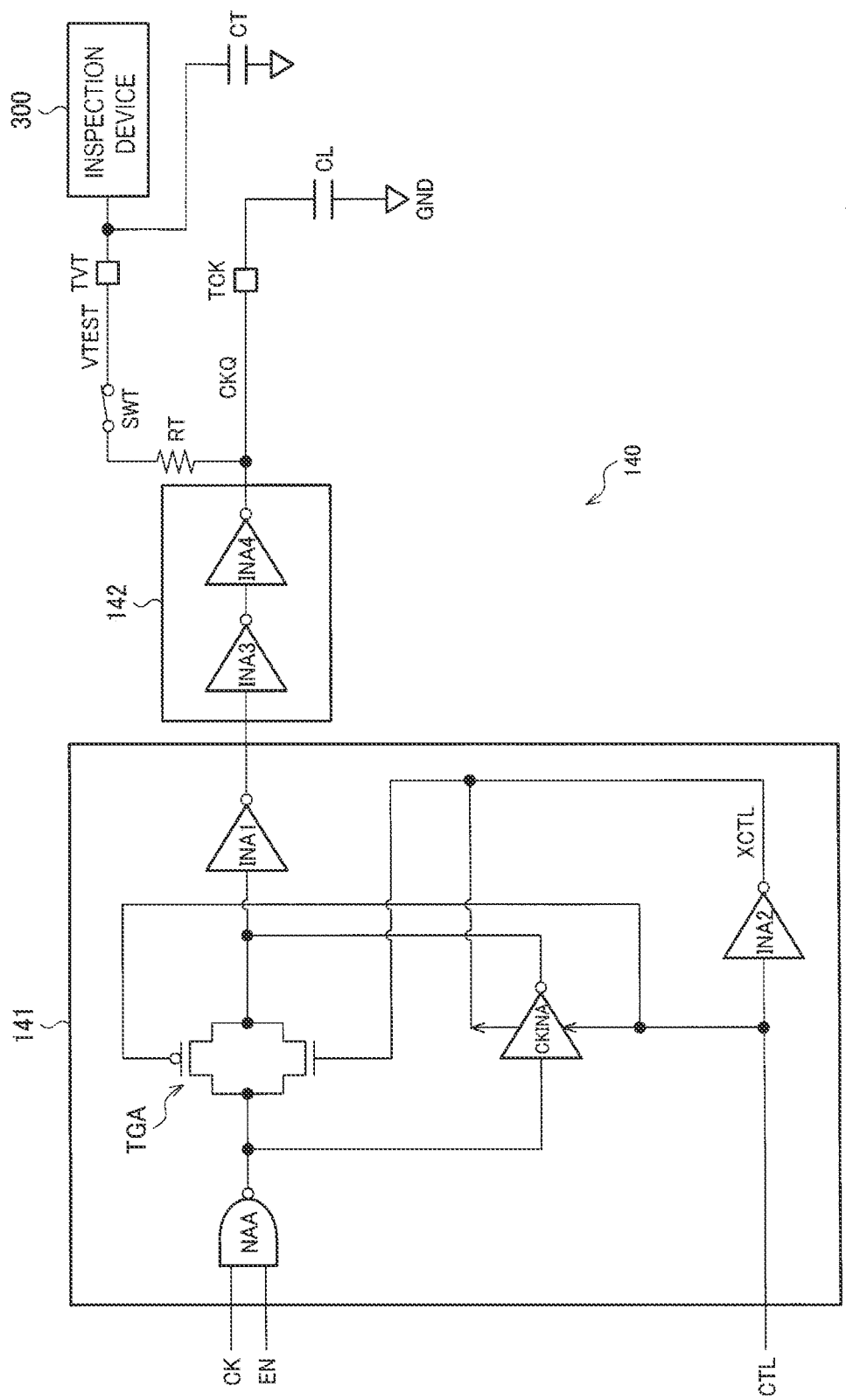
FIG. 9 illustrates a first detailed configuration example of an output circuit.

FIG. 9 illustrates a first detailed configuration example of an output circuit. The output circuit 140 includes a switching circuit 141, a buffer circuit 142, a resistor RT, and a switch SWT.

During the test, a capacitor CL is coupled between the clock terminal TCK and the node of the ground voltage GND, and the inspection device 300 is coupled to the test terminal TVT.

The switching circuit 141 outputs a normal rotation clock signal that is a normal rotation signal of the clock signal CK in the first state, and outputs a reverse rotation clock signal that is a reverse rotation signal of the clock signal CK in the second state. The switching circuit 141 includes an NAND circuit NAA, a transfer gate TGA, a clocked inverter CKINA, and inverters INA1 and INA2.

The NAND circuit NAA outputs a signal of an NAND of the clock signal CK and an enable signal EN. The enable signal EN is a signal for controlling an output of the output clock signal CKQ to be enabled or disabled and is input from the register 161 to the output circuit 140. For example, an external processing device writes the enable signal EN to the register 161 via the interface circuit 170.

The inverter INA2 outputs a reverse rotation signal XCTL of the state setting signal CTL. Here, the state setting signal CTL at a low level indicates the first state, and the state setting signal CTL at a high level indicates the second state.

The transfer gate TGA and the clocked inverter CKINA are provided in parallel in a signal path of a switching circuit. Specifically, the transfer gate TGA and the clocked inverter CKINA are coupled in parallel between an output node of the NAND circuit NAA and an input node of the inverter INA1.

The transfer gate TGA is a circuit in which a P-type MOS transistor and an N-type MOS transistor are coupled in parallel. The state setting signal CTL is input to a gate of the P-type MOS transistor, and the reverse rotation signal XCTL of the state setting signal CTL is input to a gate of the N-type MOS transistor.

The clocked inverter CKINA is a circuit in which an output state in which a reverse rotation signal of an input signal is output and a non-output state in which an output node is a high impedance are switched according to a control signal. In the clocked inverter CKINA, the reverse rotation signal XCTL of the state setting signal CTL is input to a first control node, and the state setting signal CTL is input to a second control node. The clocked inverter CKINA is in the output state when a low level is input to the first control node and a high level is input to the second control node, and is in the non-output state when a high level is input to the first control node and a low level is input to the second control node.

The inverter INA1 outputs a reverse rotation signal of a signal from the transfer gate TGA or the clocked inverter CKINA.

The buffer circuit 142 buffers an output signal of the switching circuit 141 and outputs the buffered output signal to the clock terminal TCK. The buffer circuit 142 includes inverters INA3 and INA4.

The inverter INA3 buffers the output signal of the switching circuit 141. The inverter INA4 buffers an output signal of the inverter INA3 and outputs the output clock signal CKQ, which is the normal rotation signal of the output signal of the switching circuit 141, to the clock terminal TCK.

The resistor RT and the switch SWT are coupled in series between an output node of the buffer circuit 142 and the test terminal TVT. Specifically, one end of the resistor RT is coupled to an output node of the inverter INA4, and the other end thereof is coupled to one end of the switch SWT. The other end of the switch SWT is coupled to the test terminal TVT.

When the switch SWT is on, the resistor RT is provided in series in a path from the output node of the buffer circuit 142 to the inspection device 300. A capacitor CT is provided on an input side of the inspection device 300, and functions as a low-pass filter in the path from the output node of the buffer circuit 142 to the inspection device 300. The low-pass filter smooths the output clock signal CKQ to output the DC voltage VTEST from the test terminal TVT to the inspection device 300.

FIG. 10 is an operation explanatory diagram of the first detailed configuration example of the output circuit. FIG. 10 illustrates an operation when the enable signal EN is at a high level, that is, enables an output. When the enable signal EN is at a low level, an output of the NAND circuit NAA is fixed at a high level, and the output clock signal CKQ is fixed at a low level by keeping the state setting signal CTL at a low level at this time.

Hereinafter, "0" means a low level, and "1" means a high level. Further, "on" of the clocked inverter means the output state, and "off" means the non-output state.

In the first state during the test, CTL=0 and XCTL=1. At this time, since the transfer gate TGA is on and the clocked inverter CKINA is off, the output clock signal CKQ is the normal rotation signal of the clock signal CK. During the test, the switch SWT is on, and the DC voltage VTEST output from the test terminal TVT is the first DC voltage VDC1.

In the second state during the test, CTL=1 and XCTL=0. At this time, since the transfer gate TGA is off and the clocked inverter CKINA is on, the output clock signal CKQ is the reverse rotation signal of the clock signal CK. During the test, the switch SWT is on, and the DC voltage VTEST output from the test terminal TVT is the second DC voltage VDC2.

During a clock output of the normal operation, CTL=0 and XCTL=1. At this time, the output clock signal CKQ, which is the normal rotation signal of the clock signal CK, is output from the clock terminal TCK. The switch SWT is off. In the normal operation, the capacitor CL may not be coupled to the clock terminal TCK, and a circuit using the output clock signal CKQ is coupled. Further, in the normal operation, the inspection device 300 may not be coupled to the test terminal TVT.

According to the embodiment, the output circuit 140 includes the switching circuit 141, the buffer circuit 142, the resistor RT, and the switch SWT. The switching circuit 141 outputs the normal rotation signal of the clock signal CK in the first state, and outputs the reverse rotation signal of the clock signal CK in the second state. The buffer circuit 142 buffers an output signal of the switching circuit 141 and outputs the buffered output signal to the clock terminal TCK. The resistor RT and the switch SWT are provided in series between the output node of the buffer circuit 142 and the test terminal TVT. The capacitor CT may be provided between an input side of the inspection device and the GND.

Accordingly, in the first state, the switching circuit 141 outputs the normal rotation signal of the clock signal CK, and the buffer circuit 142 buffers the normal rotation signal. Since the resistor RT is provided between the output node of the buffer circuit 142 and the test terminal TVT, the normal rotation signal can be smoothed. For example, the resistor RT is provided between the output node of the buffer circuit 142 and the test terminal TVT, and the capacitor CT is provided between the input side of the inspection device and the GND, thereby implementing the low-pass filter in the path to the inspection device and making it possible to smooth the normal rotation signal. In this way, the first DC voltage VDC1 is output from the test terminal TVT in the first state. In the second state, the switching circuit 141 outputs the reverse rotation signal of the clock signal CK, and the buffer circuit 142 buffers the reverse rotation signal. Accordingly, the second DC voltage VDC2 is output from the test terminal TVT in the second state.

In the embodiment, the switching circuit 141 includes the transfer gate TGA and the clocked inverter CKINA provided in parallel in the signal path. In the first state, the transfer gate TGA is on, and in the second state, the clocked inverter CKINA is in the output state.

Accordingly, when the transfer gate TGA is on in the first state, the switching circuit 141 can output the normal rotation signal of the clock signal CK. When the clocked inverter CKINA is in the output state in the second state, the switching circuit 141 can output the reverse rotation signal of the clock signal CK. A signal path of the switching circuit 141 is a path through which the clock signal CK is processed and transmitted in the switching circuit 141.

Figure 11:
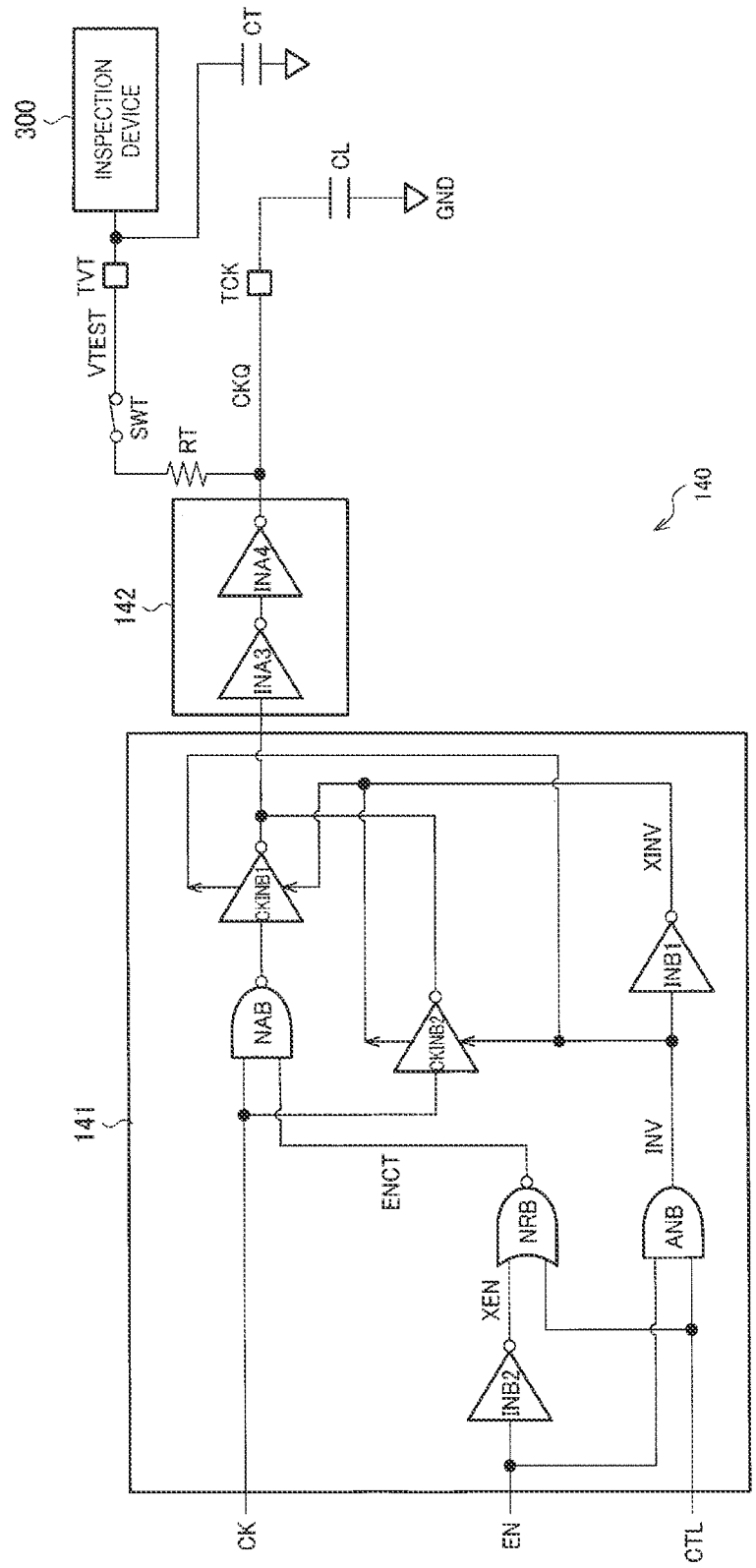
FIG. 11 illustrates a second detailed configuration example of the output circuit.

FIG. 11 illustrates a second detailed configuration example of the output circuit. The output circuit 140 includes a switching circuit 141, a buffer circuit 142, a resistor RT, and a switch SWT. Hereinafter, the same components as those in FIG. 9 are denoted by the same reference numerals as in FIG. 9, and description of the components is appropriately omitted.

The switching circuit 141 includes an NAND circuit NAB, a first clocked inverter CKINB1, a second clocked inverter CKINB2, inverters INB1 and INB2, an NOR circuit NRB, and an AND circuit ANB.

The inverter INB2 outputs a reverse rotation signal XEN of the enable signal EN. The NOR circuit NRB outputs a signal ENCT of an NOR of the reverse rotation signal XEN of the enable signal EN and the state setting signal CTL. The AND circuit ANB outputs a signal INV of an AND of the enable signal EN and the state setting signal CTL. The inverter INB1 outputs a reverse rotation signal XINV of the signal INV.

The NAND circuit NAB and the first clocked inverter CKINB1 are provided in series between an input node and an output node of the switching circuit 141 in this order. This is called a normal rotation circuit. The NAND circuit NAB outputs a signal of an NAND of the clock signal CK and the signal ENCT to an input node of the first clocked inverter CKINB1. An output node of the first clocked inverter CKINB1 is coupled to the output node of the switching circuit 141. The signal INV is input to a first control node of the first clocked inverter CKINB1, and the reverse rotation signal XINV of the signal INV is input to a second control node thereof.

The second clocked inverter CKINB2 is provided in parallel with the normal rotation circuit. The clock signal CK is input to an input node of the second clocked inverter CKINB2. An output node of the second clocked inverter CKINB2 is coupled to the output node of the switching circuit 141. The reverse rotation signal XINV of the signal INV is input to a first control node of the second clocked inverter CKINB2, and the signal INV is input to a second control node thereof.

FIG. 12 is an operation explanatory diagram of the second detailed configuration example of the output circuit. FIG. 12 illustrates an operation when the enable signal EN is at a high level, that is, enables an output. When the enable signal EN is at a low level, an output of the NAND circuit NAB is fixed at a high level. Further, an output of the signal INV is at a low level, and the second clocked inverter CKINB2 is in the non-output state. Accordingly, the output clock signal CKQ is fixed at a low level.

In the first state during the test, CTL=0, ENCT=1, INV=0, and XINV=1. At this time, the NAND circuit NAB outputs the reverse rotation signal of the clock signal CK, the first clocked inverter CKINB1 is in the output state, and the second clocked inverter CKINB2 is in the non-output state. Accordingly, the output clock signal CKQ is the normal rotation signal of the clock signal CK. During the test, the switch SWT is on, and the DC voltage VTEST output from the test terminal TVT is the first DC voltage VDC1.

In the second state during the test, CTL=1, ENCT=0, INV=1, and XINV=0. At this time, the first clocked inverter CKINB1 is in the non-output state, and the second clocked inverter CKINB2 is in the output state. Accordingly, the output clock signal CKQ is the reverse rotation signal of the clock signal CK. During the test, the switch SWT is on, and the DC voltage VTEST output from the test terminal TVT is the second DC voltage VDC2.

According to the embodiment, the switching circuit 141 includes the normal rotation circuit and the second clocked inverter CKINB2. The normal rotation circuit includes the first clocked inverter CKINB1, is provided between the input node and the output node of the switching circuit 141, and outputs the normal rotation signal of the clock signal CK when the first clocked inverter CKINB1 is in the output state. The second clocked inverter CKINB2 is provided in parallel with the normal rotation circuit. In the first state, the first clocked inverter CKINB1 is in the output state, and in the second state, the second clocked inverter CKINB2 is in the output state.

Accordingly, when the first clocked inverter CKINB1 is in the output state in the first state, the normal rotation circuit outputs the normal rotation signal of the clock signal CK. Therefore, the switching circuit 141 can output the normal rotation signal of the clock signal CK. When the second clocked inverter CKINB2 is in the output state in the second state, the switching circuit 141 can output the reverse rotation signal of the clock signal CK.

Figure 13:
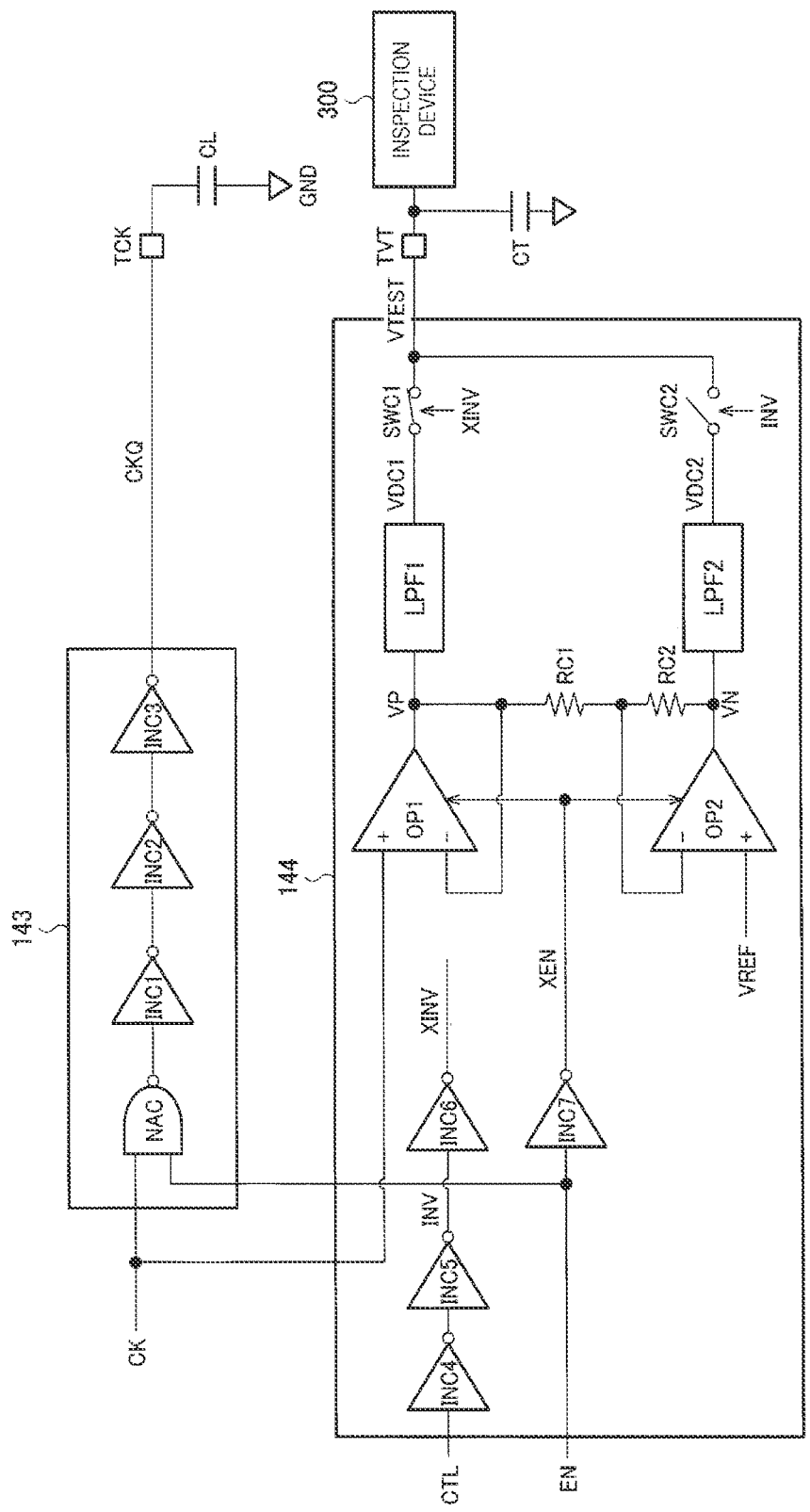
FIG. 13 illustrates a third detailed configuration example of the output circuit.

FIG. 13 illustrates a third detailed configuration example of the output circuit. The output circuit 140 includes an output buffer circuit 143 and a DC voltage generation circuit 144. Hereinafter, the same components as those in FIG. 9 are denoted by the same reference numerals as in FIG. 9, and description of the components is appropriately omitted.

The buffer circuit 142 buffers the clock signal CK to output the output clock signal CKQ to the clock terminal TCK. The output buffer circuit 143 includes an NAND circuit NAC and inverters INC1 to INC3.

The NAND circuit NAC outputs the signal of the NAND of the clock signal CK and the enable signal EN. The inverter INC1 buffers an output signal of the NAND circuit NAC. The inverter INC2 buffers an output signal of the inverter INC1. The inverter INC3 buffers an output signal of the inverter INC2 to output the output clock signal CKQ which is the normal rotation signal of the clock signal CK.

The DC voltage generation circuit 144 generates the first DC voltage VDC1 and the second DC voltage VDC2 from the clock signal CK. The DC voltage generation circuit 144 includes a first operational amplifier OP1, a second operational amplifier OP2, a first resistor RC1, a second resistor RC2, a first low-pass filter LPF1, a second low-pass filter LPF2, a first switch SWC1, a second switch SWC2, and inverters INC4 to INC7.

The inverters INC4 and INC5 buffer the state setting signal CTL to output the signal INV which is the normal rotation signal of the state setting signal CTL. The inverter INC6 outputs the reverse rotation signal XINV of the signal INV. The inverter INC7 outputs the reverse rotation signal XEN of the enable signal EN. The first operational amplifier OP1 and the second operational amplifier OP2 are in an operation state when the reverse rotation signal XEN of the enable signal EN is at a high level.

The clock signal CK is input to a non-reverse rotation input terminal of the first operational amplifier OP1. A reverse rotation input terminal and an output terminal of the first operational amplifier OP1 are coupled. A voltage follower circuit implemented by the first operational amplifier OP1 is referred to as a first amplifier circuit. The first amplifier circuit buffers the clock signal CK to output an output signal VP. The output signal VP is the normal rotation signal of the clock signal CK.

One end of the first resistor RC1 is coupled to the output terminal of the first operational amplifier OP1, and the other end thereof is coupled to a reverse rotation input terminal of the second operational amplifier OP2 and one end of the second resistor RC2. The other end of the second resistor RC2 is coupled to an output terminal of the second operational amplifier OP2. A reference voltage VREF is input to a non-reverse rotation input terminal of the second operational amplifier OP2. A reverse rotation amplifier circuit implemented by the first resistor RC1, the second resistor RC2, and the second operational amplifier OP2 is referred to as a second amplifier circuit. A gain of the second amplifier circuit is, for example, −1, and the reference voltage VREF is an amplitude center of the output signal VP of the first amplifier circuit. The second amplifier circuit outputs a reverse rotation signal of the output signal VP of the first amplifier circuit, that is, the reverse rotation signal of the clock signal CK as an output signal VN.

The first low-pass filter LPF1 and the first switch SWC1 are provided in series between an output node of the first amplifier circuit and the test terminal TVT. The first low-pass filter LPF1 smooths the output signal VP of the first amplifier circuit and outputs a result thereof as the first DC voltage VDC1. The first low-pass filter LPF1 is, for example, a passive low-pass filter using a resistor and a capacitor, and is not limited thereto. One end of the first switch SWC1 is coupled to an output node of the first low-pass filter LPF1, and the other end thereof is coupled to the test terminal TVT. The first switch SWC1 is controlled to be on or off based on the reverse rotation signal XINV of the signal INV.

The second low-pass filter LPF2 and the second switch SWC2 are provided in series between an output node of the second amplifier circuit and the test terminal TVT. The second low-pass filter LPF2 smooths the output signal VN of the second amplifier circuit and outputs a result thereof as the second DC voltage VDC2. The second low-pass filter LPF2 is, for example, a passive low-pass filter using a resistor and a capacitor, and is not limited thereto. One end of the second switch SWC2 is coupled to an output node of the second low-pass filter LPF2, and the other end thereof is coupled to the test terminal TVT. The second switch SWC2 is controlled to be on or off based on the signal INV.

FIG. 14 is an operation explanatory diagram of the third detailed configuration example of the output circuit. Hereinafter, "on" of the operational amplifier means an operation state, and "off" means a non-operation state.

In the first state during the test, CTL=0, EN=0, INV=0, XINV=1, and XEN=1. At this time, the first operational amplifier OP1 and the second operational amplifier OP2 are on, the first switch SWC1 is on, and the second switch SWC2 is off. Accordingly, the DC voltage VTEST output from the test terminal TVT is the first DC voltage VDC1 output by the first low-pass filter LPF1.

In the second state during the test, CTL=1, EN=0, INV=1, XINV=0, and XEN=1. At this time, the first operational amplifier OP1 and the second operational amplifier OP2 are on, the first switch SWC1 is off, and the second switch SWC2 is on. Accordingly, the DC voltage VTEST output from the test terminal TVT is the second DC voltage VDC2 output from the second low-pass filter LPF2.

During a clock output of the normal operation, the CTL is either 0 or 1, EN=1, and XEN=0. At this time, the output buffer circuit 143 buffers the clock signal CK to output the output clock signal CKQ. Since the first operational amplifier OP1 and the second operational amplifier OP2 are off, the DC voltage VTEST is not generated.

According to the third detailed configuration example, since the DC voltage VTEST is generated from the clock signal CK whose waveform is distorted by the output buffer circuit 143, the duty can be brought closer to 50% more accurately. This point will be described with reference to FIGS. 15 and 16.

Although an ideal rectangular wave signal whose duty is 50% does not have an even-order harmonic, a rectangular wave signal whose duty is not 50% has an even-order harmonic. Ideally, by determining the duty such that the difference value ΔVDC of the DC voltage is zero, a total harmonic distortion of the even-order harmonic is minimized, and the duty can be determined to be 50%. However, the even-order harmonic is generated due to a distortion of a signal waveform. Then, regardless of what causes the even-order harmonic, it affects the DC voltage obtained from the clock signal. Therefore, even when the duty is determined to be 50% based on the difference value ΔVDC of the DC voltage and the total harmonic distortion of the even-order harmonic is minimized at this time, the total harmonic distortion of the even-order harmonic due to the duty may be not minimized, that is, the duty may have an error with respect to 50%.

Figure 15:
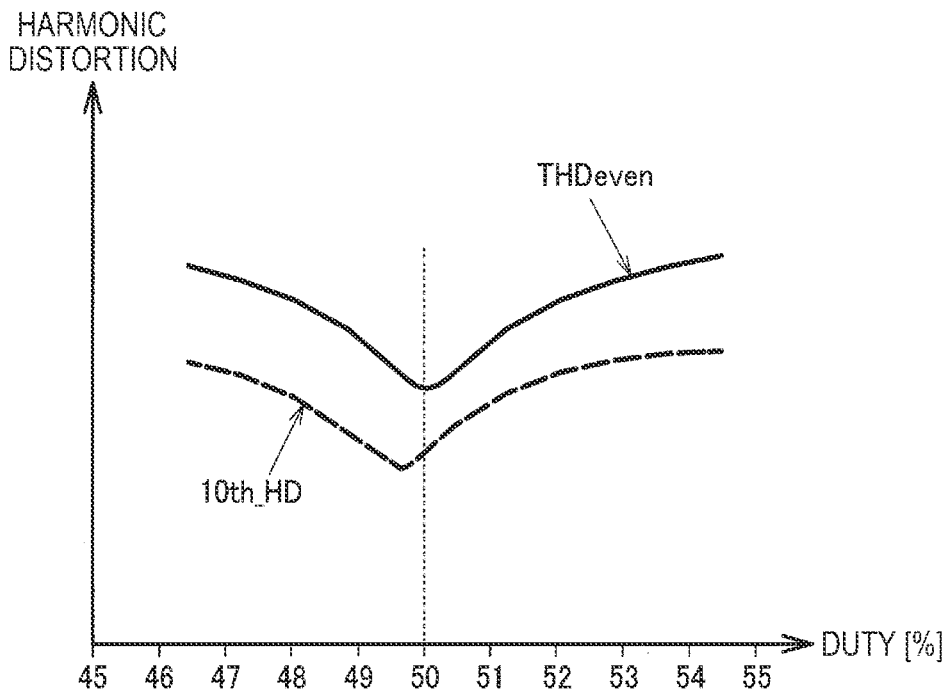
FIG. 15 is a diagram illustrating a correlation between a duty of a clock signal whose waveform is distorted and a harmonic distortion.
Figure 16:
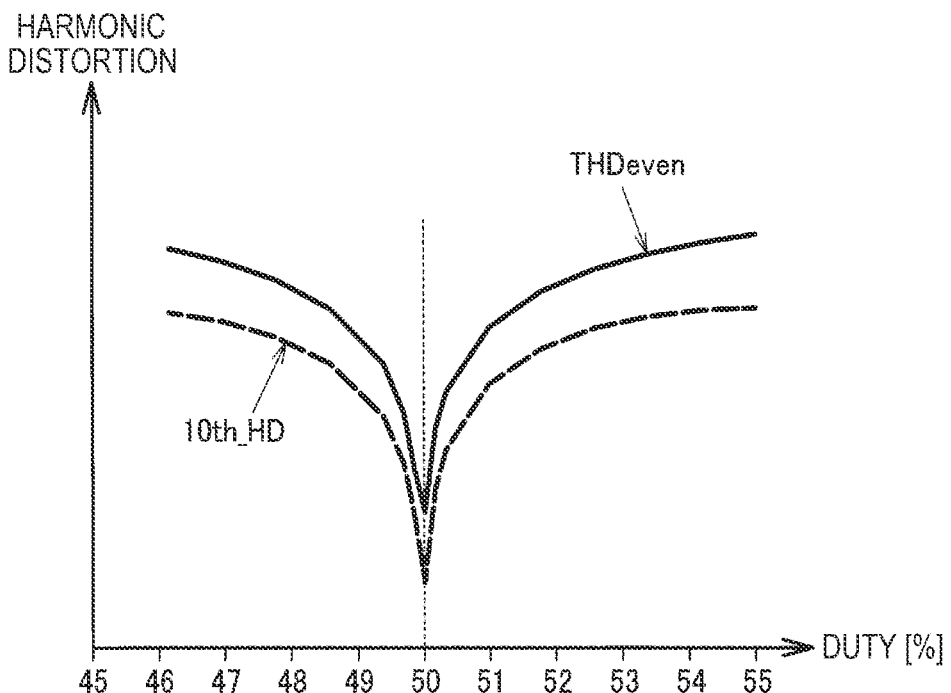
FIG. 16 is a diagram illustrating a correlation between a duty of a clock signal and a harmonic distortion in the embodiment.

FIG. 15 is a diagram illustrating a correlation between a duty of a clock signal whose waveform is distorted and a harmonic distortion. FIG. 16 is a diagram illustrating a correlation between a duty of a clock signal and a harmonic distortion in the embodiment. THDeven is the total harmonic distortion of the even-order harmonic. As an example of the even-order harmonic, a tenth harmonic distortion 10th_HD is shown.

Comparing FIGS. 15 and 16, when the clock signal is distorted, an even-order harmonic distortion is large at the duty of 50%. Since it is impossible to distinguish whether the even-order harmonic distortion is caused by the duty or the distortion of the signal waveform, it is an error factor in the duty. In contrast, in the embodiment, the DC voltage is generated from the clock signal CK in a state where an edge of the clock signal rises, and the even-order harmonic distortion at the duty of 50% of the clock signal CK is small. Therefore, it is less likely to be affected by the even-order harmonic distortion caused by the distortion of the signal waveform, and the even-order harmonic distortion caused by the duty can be minimized, that is, the duty can be accurately determined to be 50%.

According to the embodiment, the output circuit 140 includes the voltage-follower-coupled first amplifier circuit to which the clock signal CK is input and the second amplifier circuit that reverses the output signal VP of the first amplifier circuit. The output circuit 140 includes the first low-pass filter LPF1 and the first switch SWC1 that are provided between the output node of the first amplifier circuit and the test terminal TVT, and the second low-pass filter LPF2 and the second switch SWT2 that are provided between the output node of the second amplifier circuit and the test terminal TVT. In the first state, the first switch SWT1 is on, and in the second state, the second switch SWT2 is on.

Accordingly, in the first state, the voltage-follower-coupled first amplifier circuit outputs the normal rotation signal of the clock signal CK, the first low-pass filter LPF1 smooths the normal rotation signal to the first DC voltage VDC1, and the first DC voltage VDC1 is output from the test terminal TVT through the first switch SWT1. In the second state, the second amplifier circuit that reverses the output signal VP of the first amplifier circuit outputs the reverse rotation signal of the clock signal CK, the second low-pass filter LPF2 smooths the reverse rotation signal to the second DC voltage VDC2, and the second DC voltage VDC2 is output from the test terminal TVT through the second switch SWT2.

In the embodiment, the first amplifier circuit includes the first operational amplifier OP1. The clock signal CK is input to the non-reverse rotation input terminal of the first operational amplifier OP1, and the reverse rotation input terminal and the output terminal of the first operational amplifier OP1 are coupled. The second amplifier circuit includes the second operational amplifier OP2, the first resistor RC1, and the second resistor RC2. The reference voltage VREF is input to the non-reverse rotation input terminal of the second operational amplifier OP2. The first resistor RC1 is provided between the output terminal of the first operational amplifier OP1 and the reverse rotation input terminal of the second operational amplifier OP2. The second resistor RC2 is provided between the reverse rotation input terminal and the output terminal of the second operational amplifier OP2.

Accordingly, the reverse rotation input terminal and the output terminal of the first operational amplifier OP1 are coupled to implement the voltage-follower-coupled first amplifier circuit. Then, by inputting the clock signal CK to the non-reverse rotation input terminal of the first operational amplifier OP1, the first amplifier circuit can output the normal rotation signal of the clock signal CK. The first resistor RC1 is provided between the output terminal of the first operational amplifier OP1 and the reverse rotation input terminal of the second operational amplifier OP2, and the second resistor RC2 is provided between the reverse rotation input terminal and the output terminal of the second operational amplifier OP2, thereby implementing the second amplifier circuit that reverses the output signal VP of the first amplifier circuit. Accordingly, the second amplifier circuit can output the reverse rotation signal of the clock signal CK.

3. Oscillator

Figure 17:
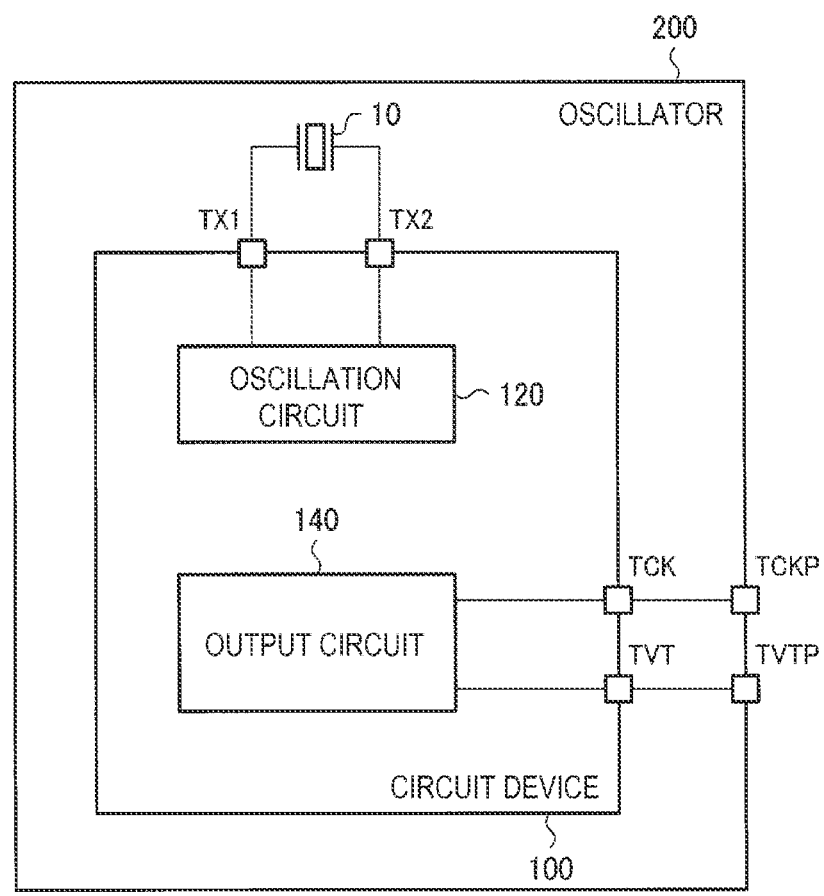
FIG. 17 illustrates a configuration example of an oscillator including the circuit device of the embodiment.

FIG. 17 illustrates a configuration example of an oscillator including the circuit device of the embodiment. An oscillator 200 includes the circuit device 100 and the resonator 10. In FIG. 17, only the oscillation circuit 120 and the output circuit 140 are illustrated among components of the circuit device 100, and illustration of other components is omitted.

The oscillator 200 may include a package that accommodates the circuit device 100 and the resonator 10. For example, the circuit device 100 and the resonator 10 may be accommodated in a base, and the package may be sealed by joining a lid to the base. Alternatively, the oscillator 200 may be implemented by a package of a wafer level in which the semiconductor substrate of the circuit device 100 is a part of the package. For example, the resonator 10 may be mounted at the semiconductor substrate of the circuit device 100, and the lid may be bonded to the semiconductor substrate to cover the resonator 10.

The circuit device 100 includes the terminals TX1 and TX2 coupled to the oscillation circuit 120. The resonator 10 is coupled between the terminals TX1 and TX2. The oscillator 200 includes a terminal TCKP. The terminal TCKP is coupled to the clock terminal TCK coupled to the output circuit 140. The oscillator 200 may further include a terminal TVTP. The terminal TVTP is coupled to the test terminal TVT coupled to the output circuit 140. The terminal TVTP may be not provided and the test terminal TVT may be an internal terminal of the oscillator 200.

Although the embodiment has been described in detail above, it can be easily understood by those skilled in the art that many modifications are possible without substantially departing from the novel matters and effects of the present disclosure. Accordingly, all such modifications are within the scope of the present disclosure. For example, a term described at least once together with a different term having a broader meaning or the same meaning in the description or the drawings can be replaced with the different term at any place in the description or the drawings. All combinations of the embodiment and the modifications are also included in the scope of the present disclosure. Configurations and operations of the oscillation circuit, the clock signal generation circuit, the output circuit, the duty adjustment circuit, the storage circuit, the interface circuit, the circuit device, the resonator, the oscillator, the inspection device, and the like are not limited to those described in the embodiment, and various modifications can be made.

What is claimed is:

1. A circuit device comprising:
a clock signal generation circuit configured to generate a clock signal;
an output circuit configured to output an output clock signal based on the clock signal;
a clock terminal configured to output the output clock signal;
a test terminal;
a storage circuit configured to store a duty adjustment value; and
a duty adjustment circuit configured to adjust a duty of the clock signal based on the duty adjustment value, wherein
the output circuit
outputs a first DC voltage based on a normal rotation signal of the clock signal to the test terminal in a first state, and
outputs a second DC voltage based on a reverse rotation signal of the clock signal to the test terminal in a second state.

2. The circuit device according to claim 1, wherein the output circuit includes
a switching circuit configured to output the normal rotation signal of the clock signal in the first state and output the reverse rotation signal of the clock signal in the second state,
a buffer circuit configured to buffer an output signal of the switching circuit and output the buffered output signal to the clock terminal, and
a resistor and a switch provided in series between an output node of the buffer circuit and the test terminal.

3. The circuit device according to claim 2, wherein the switching circuit includes a transfer gate and a clocked inverter provided in parallel in a signal path, and
the transfer gate is on in the first state and the clocked inverter is in an output state in the second state.

4. The circuit device according to claim 2, wherein the switching circuit includes
a normal rotation circuit including a first clocked inverter, provided between an input node and an output node of the switching circuit, and configured to output the normal rotation signal of the clock signal when the first clocked inverter is in an output state, and
a second clocked inverter provided in parallel with the normal rotation circuit, and
the first clocked inverter is in the output state in the first state and the second clocked inverter is in an output state in the second state.

5. The circuit device according to claim 1, wherein the output circuit includes
a voltage-follower-coupled first amplifier circuit configured to receive the clock signal,
a second amplifier circuit configured to reverse an output signal of the first amplifier circuit,
a first low-pass filter and a first switch provided between an output node of the first amplifier circuit and the test terminal, and
a second low-pass filter and a second switch provided between an output node of the second amplifier circuit and the test terminal, and
the first switch is on in the first state, and the second switch is on in the second state.

6. The circuit device according to claim 5, wherein the first amplifier circuit includes a first operational amplifier including a non-reverse rotation input terminal configured to receive the clock signal, and a reverse rotation input terminal and an output terminal which are coupled, and
the second amplifier circuit includes
a second operational amplifier including a non-reverse rotation input terminal configured to receive a reference voltage,
a first resistor provided between the output terminal of the first operational amplifier and a reverse rotation input terminal of the second operational amplifier, and
a second resistor provided between the reverse rotation input terminal of the second operational amplifier and an output terminal of the second operational amplifier.

7. The circuit device according to claim 1, further comprising:
a register configured to store a state setting signal for switching between the first state and the second state; and
an interface circuit configured to receive the state setting signal from an outside and write the received state setting signal to the register.

8. The circuit device according to claim 1, wherein the clock signal generation circuit includes
an oscillation circuit configured to generate an oscillation signal, and
a waveform shaping circuit configured to waveform-shape the oscillation signal to output the clock signal, and
the duty adjustment circuit sets, based on the duty adjustment value, a bias voltage of the oscillation signal input to the waveform shaping circuit.

9. An oscillator comprising:
the circuit device according to claim 1; and
a resonator configured to generate the clock signal.

10. A method for manufacturing an oscillator including a circuit device,
the circuit device including:
a clock signal generation circuit configured to generate a clock signal;
an output circuit configured to output an output clock signal based on the clock signal;
a clock terminal configured to output the output clock signal;
a test terminal;
a storage circuit configured to store a duty adjustment value; and
a duty adjustment circuit configured to adjust a duty of the clock signal based on the duty adjustment value,
the method for manufacturing an oscillator comprising:
setting the circuit device to a first state in which the output circuit outputs a first DC voltage based on a normal rotation signal of the clock signal to the test terminal;
measuring the first DC voltage;
setting the circuit device to a second state in which the output circuit outputs a second DC voltage based on a reverse rotation signal of the clock signal to the test terminal;
measuring the second DC voltage; and
setting the duty adjustment value based on a difference value between the first DC voltage and the second DC voltage and writing the set duty adjustment value to the storage circuit.

* * * * *